United States Patent [19]
Pascucci et al.

[11] Patent Number: 5,218,570
[45] Date of Patent: Jun. 8, 1993

[54] SENSE CIRCUIT FOR READING DATA STORED IN NONVOLATILE MEMORY CELLS

[75] Inventors: Luigi Pascucci, Sesto S. Giovanni; Marco Olivo, Bergamo, both of Italy

[73] Assignee: SGS-Thomson Microelectronics s.r.l., Italy

[21] Appl. No.: 657,083

[22] Filed: Feb. 19, 1991

[30] Foreign Application Priority Data

Feb. 23, 1990 [IT] Italy .................. 83607 A/90

[51] Int. Cl.$^5$ .................................... G11L 13/00
[52] U.S. Cl. ........................ 365/189.01; 365/208; 365/210; 307/530
[58] Field of Search .............. 365/202, 207, 208, 210, 365/189.09, 189.01, 201, 204; 307/530

[56] References Cited

U.S. PATENT DOCUMENTS

| | | | |
|---|---|---|---|
| 4,649,301 | 3/1987 | Van Tran | 365/208 |
| 4,661,926 | 4/1987 | Lee | 365/104 |
| 4,713,797 | 12/1987 | Morton et al. | 307/530 |
| 4,727,519 | 2/1988 | Morton et al. | 365/233 |
| 4,949,307 | 8/1990 | Campardo | 365/189.09 |

FOREIGN PATENT DOCUMENTS

| | | |
|---|---|---|
| 0326004 | 8/1989 | Italy . |
| 0337433 | 10/1989 | Japan . |
| 0347935 | 12/1989 | Japan . |

Primary Examiner—Timothy P. Callahan

[57] ABSTRACT

A sense circuit for reading EPROM and ROM type memory cells employs a circuit for generating an offsetting current which is exempt of error during transients and which thus permits to achieve a reduced access time. On the other hand, the sense circuit maintains the intrinsic advantages of a current-offset sensing architecture which is represented by a substantially unlimited operating voltage range toward the maximum value $VCC_{max}$. The current generating circuit is driven by means of a supplementary row of cells which is decoded at every reading and which replicates, during transients, the behaviour of the row selected for the reading.

3 Claims, 3 Drawing Sheets

REFERENCE CELL / ARRAY CELL

REFERENCE CELL / ARRAY CELL

SENSE CIRCUIT FOR READING DATA STORED IN NONVOLATILE MEMORY CELLS

BACKGROUND OF THE INVENTION

The present invention relates to a circuit for reading the information stored in ROM and EPROM type memories according to a differential sensing mode and, in particular to an improved circuit for generating an offsetting current for discriminating between the currents which flow through a certain cell of the memory array which has been selectively addressed for reading and a virgin reference cell, according to a current offset sensing mode.

Among semiconductor nonvolatile memories, EPROM memories represent one of the most advanced field of integration in silicon. Starting from nowadays common 1 megabit devices, new devices with a capacity of up to 4 megabit have been presented lately and new ambitious goals are announced.

Together with an ever increasing packing density, the memory market requires improved performances in terms of access time, write time and power consumption. The reduction of the size of the devices poses serious problems to the achievement of these aims. In particular, the access time during a reading phase is penalized by a consequent reduction of the actual current through the memory cell and an increased influence of parasitic electric factors of the integrated structure of the cells. For these reasons, the circuits used for reading the information stored in the cells must possess an enhanced precision and reliability.

The article entitled "L'amplificatore di Lettura nei Dispositivi di Memoria EPROM" by G. Compardo, M. Dallabora and D. Novosel, published on the journal "Alta Frequenza" Vol. LVII—No. 6—July-August 1988, contains a comprehensive review of the different sense circuits which are commonly used. The relevant content of this article is intended to be incorporated herein by express reference thereto.

Basically, the architecture of a differential type sense circuit are by far more precise and less sensitive to the effects of "process spread", temperature and supply voltage variations, by treating them essentially as common mode contributions. On the other hand, there are two differential sense systems: a load-offset type and a current-offset type. A load-offset (or load-unbalance) type sense circuit and the relative operating characteristics are reproduced in FIGS. 1 and 2, respectively. The reading system is based, as it is well known, upon the unbalancing of the load transistors, respectively of the "array cell" side and of the "reference cell" side (where the reference cell is commonly constituted by a virgin memory cell), by making larger than unity the dimensional ratio between the two load transistors.

The unbalancing of the loads permits the reading of a virgin cell by introducing an element of asymmetry between the two branches of the differential sense circuit. In the diagram of FIG. 2, the respective characteristics of a virgin cell ($I_{on}$) and of a written cell ($I_{off}$) and of the reference current ($I_{ref}$) are all shown on a single diagram purposely.

In this type of sense circuit, the reference current $I_{ref}$ varies with the varying of the supply voltage VCC which is applied to the control gate of the reference cell. The minimum working voltage $VCC_{min}$ is in this case limited by the threshold of a virgin cell $V_{th}$, while the maximum operating voltage $VCC_{max}$ is given by the equality between $I_{ref}$ and $I_{off}$.

Clearly the system has limitations, in static terms, toward the value of $VCC_{max}$ and this constitutes a drawback. A further drawback may be identified by the necessity of forming transistors having different geometrical dimensions among each other and by the necessity of employing a relatively complex sense circuit.

A typical circuit diagram and relative characteristics of a sensing system operating in a current-offset mode, are shown in FIGS. 3 and 4, respectively. According to this known alternative approach, the operating range in terms of voltage VCC is widened by modifying the reference current $I_{ref}$ characteristic. In the relative circuit diagram, as it may be observed in FIG. 3, the load transistors have similar dimensions. The element of asymmetry which is necessary for discriminating the sensing of a virgin cell, is provided by means of a constant current $I_{offset}$ which is purposely added in parallel to the cell current of the array side.

In this way, the electrical characteristics of the cells are caused to be parallel to the characteristic of the reference current. The remarkable result is that the $VCC_{max}$ value tends theorethically to infinity for all the cells which have undergone a threshold shift ($\delta V_{th}$) larger than the value of said additional constant current ($I_{offset}$) divided by the current gain of the cell: i.e.

$$\delta V_{th} > \frac{I_{offset}}{\beta}$$

As described in the above mentioned article, in order to improve discrimination at the limit $VCC_{min}$, the contribution of the offset current is added singly on the reference side and doubled on the array side. This is schematically shown in FIG. 3 by the "two generators": $I_{offset}$ and $I_{offset}/2$, which determine the respective offset currents through the two branches of the input circuit of the differential sense amplifier A. In this way, the three characteristics: $I_{on}$, $I_{ref}$ and $I_{off}$, of the operating diagram of FIG. 4, are always kept separated for:

$$VCC > V_{th} = VCC_{min}$$

There is however another order of considerations on sense circuits concerning their dynamic characteristics. In other words, the static characteristics discussed above, define the correct margin of operation, that is of correct interpretation of the data stored in an array cell, in function of the supply voltage and therefore they offer a measure of the width of the operating range of the sense circuits toward VCC, in the hypotesis that all transients, such as the precharging of the column lines (BITLINES), the signal propagation along the relative row of the array and so forth have terminated.

Viceversa, the dynamic characteristics have a relevance on the currents passing in the two branches of the input circuit of the differential sense amplifier during a typical reading phase, during which the actual supply voltage of the device is set, thus providing for an evaluation of the correct operation margin during a transient. These dynamic characteristics are indicative of how small will be the access time of the memory, because the response of the sense circuits will be correct only from the moment in which the current of the reference side is smaller than the current of the array side when reading a conducting cell (ON-programmed cell), and viceversa, when reading a nonconducting cell (OFF-programmed cell).

Moreover, this latter consideration is fundamental for recognizing an intrinsic limit of a current-offset type sense circuit.

In fact, while for the case of a load-unbalance system, the current in the two branches (reference side and array side) of the sense circuit are intrinsically different for any value of the gate voltage of the cells (and therefore the circuit provides a correct sensing during a transient), in the case of a current-offset sense circuit, because the circuit is powered at VCC, there is not a transient phase for the value of the current set by the offsetting circuit and therefore, when an OFF-programmed cell must be read, the sense circuit initially provides an erroneous response because the reference side current, for a low value of the voltage applied to the gate of the array cell and of the reference cell, is lower than the current of the array side, which current represents the sum of the offsetting current, which is intrinsically constant, and of the current of the OFF-programmed cell, which is practically nil.

Only when the voltage on the gate of the reference cell whose value depends from the propagation of the signal through the array's row, becomes sufficient to generate a current through the cell greater than the offsetting current, a correct response is obtained from the circuit. This limitation at transients negatively affects the access time in comparison to the case where a load-unbalance sense circuit is used, which, on the other hand, has the disadvantage of providing a reduced operating voltage range, as seen before.

OBJECTIVE AND SUMMARY OF THE INVENTION

There is a need for a sense circuit which although possessing static operating characteristics comparable to the static operating characteristics of a current-offset type circuit or anyway having a wide operating range toward the maximum supply voltage ($VCC_{max}$) also possess improved dynamic characteristics as compared to a current-offset circuit of the known type.

This objective is reached by means of the current-offset sense circuit which forms the object of the present invention.

Basically, the device for generating an unbalance between a reference cell branch of the sense circuit and another branch of the circuit comprising the selectively addressed array cell to be read, which is employed is basically a current generator and therefore, as in the case of a currentoffset sense circuit of the prior art, the sizes of the load transistors of the array side and of the reference side of the differential sense circuit are advantageously identical, thus avoiding the above mentioned drawbacks typical of a load-unbalance sense circuit. The circuit is driven essentially by the same gate voltage which is present on the array cells and for this purpose it is necessary to introduce in the array of cells a supplementary row which is decoded at every reading, and which replicates during transients the behaviour of the array's row which is selected for reading.

DESCRIPTION OF THE PREFERRED EMBODIMENT

Figure 3:
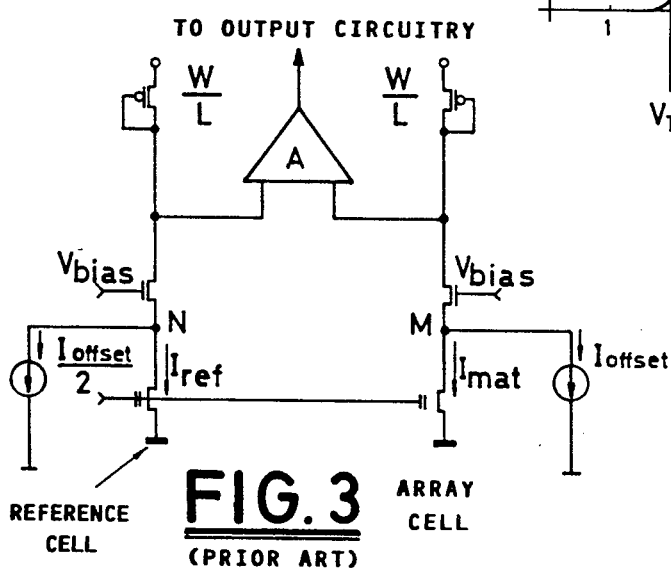
FIG. 3 is a basic circuit diagram of a current-offset type, sense circuit.
Figure 4:
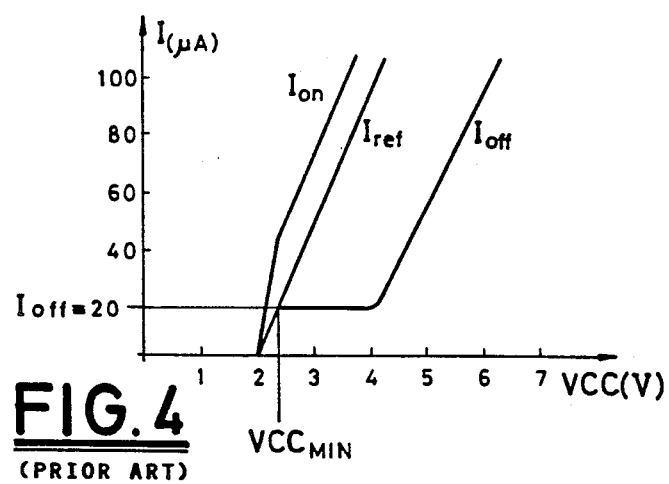
FIG. 4 is a diagram depicting the operation of the sense circuit of FIG. 3.
Figure 5:
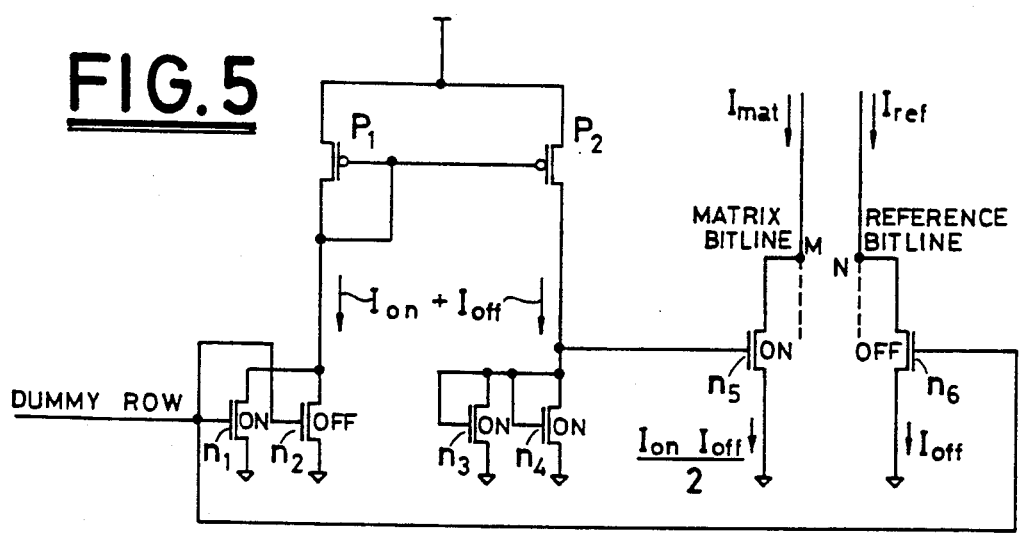
FIG. 5 is a circuit diagram of an offsetting current generating circuit made in accordance with a first embodiment of the present invention.
Figure 8:
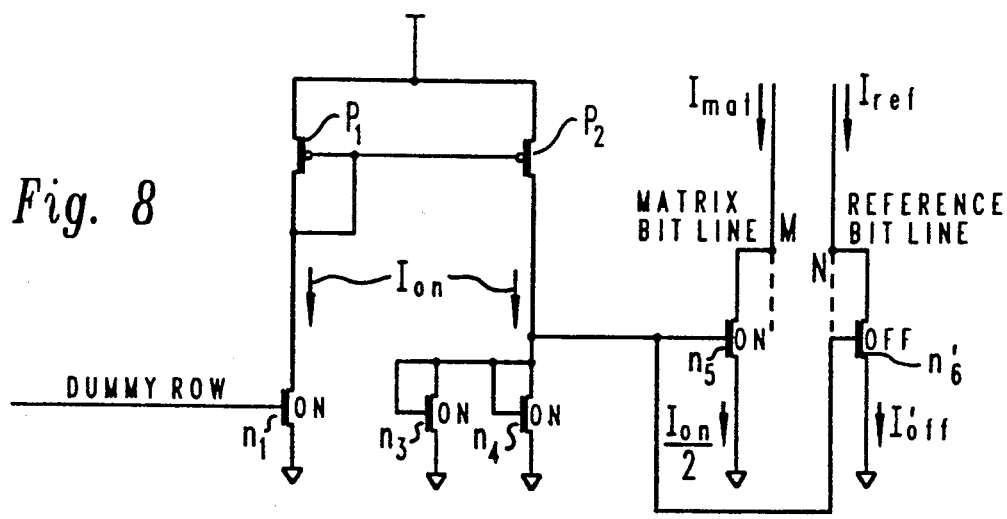
FIG. 8 is a circuit diagram of the offsetting current generating circuit of the invention according to a different embodiment.

For simplicity's sake, in the circuit diagram of FIGS. 5 and 8, only the offsetting current generating circuit of the offset-current-type sense circuit as shown in FIG. 3 is depicted; the circuit nodes M and N of the circuit of FIG. 3 being indicated in the so-partialized circuit diagrams of FIGS. 5 and 8.

Moreover the label DUMMY ROW used in FIGS. 5 and 8, indicates a drive voltage line derived from a supplementary row of cells of the array of cells which is decoded at every reading and which therefore replicates perfectly the behaviour of anyone row of memory cells of the array which is selected for reading, during a transient.

Normally, the reference column line, REFERENCE BITLINE, serves a certain number of column lines, MATRIX BITLINE, of the array and to these is adjacently formed on the silicon chip so as to make as similar as possible the voltages present on the gate of the reference cell and on the gate of a selected cell of the array also during transients, the latter having a nonnegligeable duration because of the RC value of a row of the array. This topographic closeness between these lines further enhances a maximum geometrical identity of the relative reference cells and array cells.

With reference to the circuit shown in FIG. 5, n1, n3, n4 and n5 are cells (transistors) electrically equivalent to anyone memory cell of the memory array programmed in an ON-condition. According to this first preferred embodiment, the circuit is provided also with two compensation transistors n2 and n6, which are functionally unnecessary, but serve advantageously as compensating elements when the array cells, programmed in an-OFF condition (written cells) are not in a perfectly cut-off condition, but which in practice begin to conduct a certain current, in the order microampers, beyond a certain level of the driving voltage applied thereto. This condition is "replicated", by analogy, also by said transistors (cells) n2 and n6, which are electrically equivalent to any other memory cell of the array programmed in an OFF-condition, thus obtaining as a result a perfect compensation of the current which may be conducted by written memory cells and which would disturb the process of unbalancing the currents which is performed by the circuit of the invention, thus introducing a certain limitation toward the maximum value of the driving voltage ($VCC_{max}$) by "bending" the current characteristic of the reference branch of the circuit toward the current characteristic of a written (OFF) cell until crossing it. As shown, n1, n2 and n6 are driven by said supplementary array row, DUMMY ROW, and are topologically near, on the silicon chip, to the reference column line: REFERENCE BITLINE and to the respective array column lines: MATRIX BITLINE. This means that during a transient the voltages on the gates of the reference cell and of the array cell (not shown in FIG. 5), as well as on the gates of the transistors n1, n2 and n6, are very similar and may be considered equal to each other.

By supposing initially to neglect the contribution given by the optional compensation transistors n2 and n6 and by observing that, by assuming that all the cells (array, reference and nl) are in a saturation condition, the current of the cell nl is equal in any instant to the current flowing through any selected ON-programmed cell of the array, because these currents depend exclusively on the respective gate voltages, which are equal in both cells also during a transient. The current $I_{on}$ generated by the cell nl, which is identical to the current flowing through the selected cell of the array which must be read, is mirrored by the current mirror formed by the transistors p1 and p2 into the right hand branch of the mirror and it is divided into two identical semi-currents by means of the n-channel current mirror formed by the transistors n3, n4 and n5, all having the same size, and it is further delivered to the column line of the array side (MATRIX BITLINE). By defining the so-obtained current: $I_{offset}$, and having neglected for the moment the contribution of the cell n2, the following relation holds:

$$I_{on} = 2 * I_{offset}.$$

Figure 1:
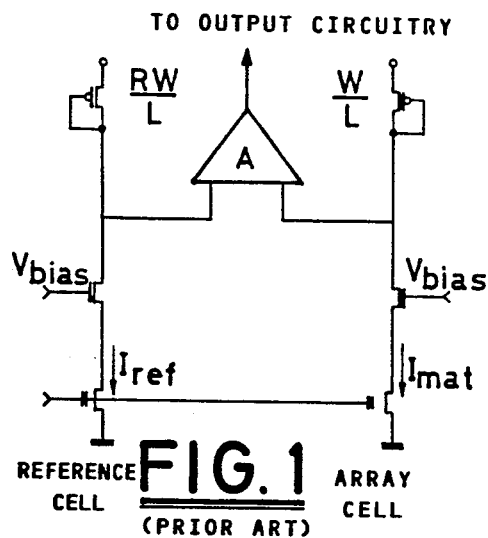
FIG. 1 is a basic circuit diagram of a load-unbalance type, sense circuit.
Figure 2:
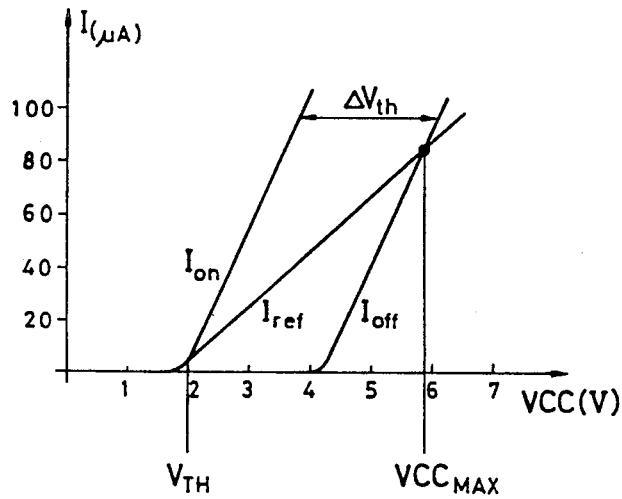
FIG. 2 is a diagram depicting the operation of the sense circuit of FIG. 1.

The effect of unbalancing the currents of the two input branches (MATRIX BITLINE and REFERENCE BITLINE, respectively) of the differential sense circuit so obtained, is from both a static and a dynamic point of view, substantially similar to the effect obtained in a load-unbalance type, sense circuit, where the size of the load of the reference side is twice the size of the load of the array side, thus producing an operating characteristic similar to the one depicted in FIG. 2. The unbalancing circuit is, on the other hand, exempt of the drawbacks of a load-unbalance circuit. Any limitation toward the maximum value of the driving voltage (VCC$_{max}$) is effectively eliminated by means of the optional compensation transistors n2 and n6, which are, as already said, equivalent to a programmed array cell, i.e. have a high threshold, as a cell in an OFF-condition, and they are driven by the supplementary row DUMMY ROW, of the array as the cell nl. The drain of the transistor n6 is connected to the reference column line: REFERENCE BITLINE, while the eventual current contribution of the transistor (cell) n2, which is substantially connected in common with the first transistor n1, and which will essentially be identical to the current eventually carried by a written memory cell (OFF-programmed cell) of the array, will be summed with the current generated by nl, thus producing a sum current ($I_{on} + I_{off}$) of the currents generated by n1 and n2, respectively.

The result is easily analyzed as follows:

1. Reading of an array's ON-programmed cell
$I_{ref} = I_{on} + I_{n6} = I_{on} + I_{off}$ -continued
$$I_{mat} = I_{on} + I_{offset} = I_{on} + \frac{I_{on} + I_{off}}{2} = \frac{3}{2} \cdot I_{on} + \frac{1}{2} I_{off}$$

since the condition $I_{ref} < I_{mat}$ must hold, thence $I_{on} > I_{off}$ a disequality which always holds in practice for any value of the gate voltage of the cells.

2. Reading of an array's OFF-programmed cell
$I_{ref} = I_{on} + I_{n6} = I_{on} + I_{off}$ $$I_{mat} = I_{off} + I_{offset} = I_{off} + \frac{I_{on} + I_{off}}{2} = \frac{3}{2} \cdot I_{off} + \frac{1}{2} I_{on}$$

since $I_{ref} > I_{mat}$ must always holds, also in this case the following disequality must hold: $I_{on} > I_{off}$, which is true for any value of the gate voltage of the cells.

Figure 6:
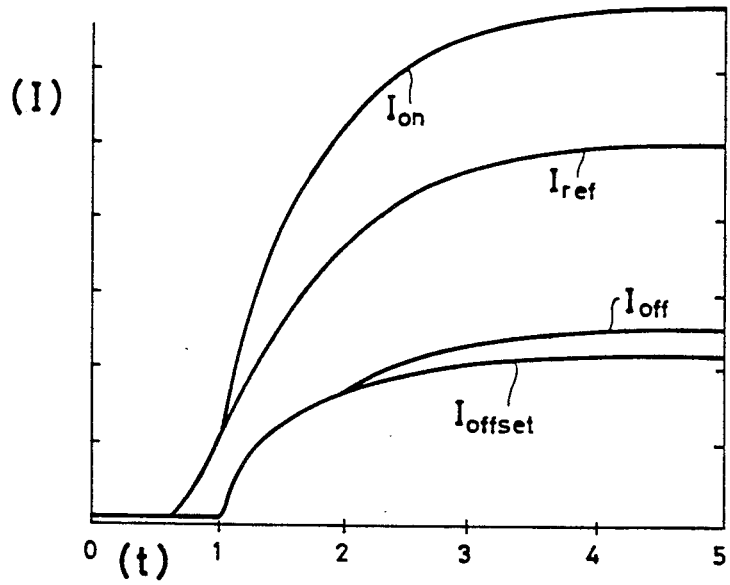
FIG. 6 depicts the dynamic characteristics of operation of the circuit of FIG. 5.
Figure 7:
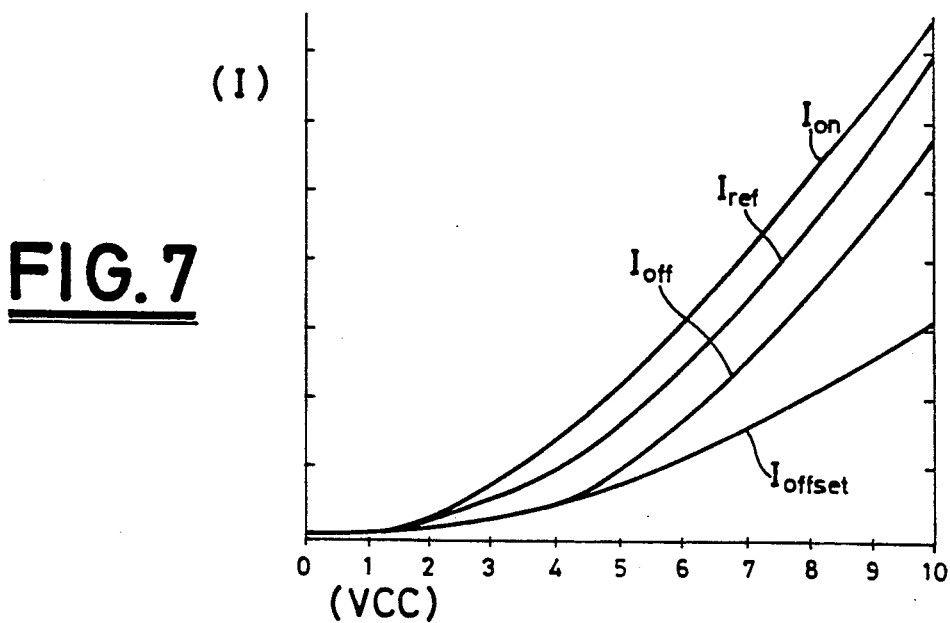
FIG. 7 depicts the static characteristics of operation of the circuit of FIG. 5.

The dynamic characteristics of operation of the current generating circuit of FIG. 5 are shown in the diagram of FIG. 6 and the static characteristics of operation of the circuit shown in the diagram of FIG. 7 make evident the advantages which are achieved by the circuit of the invention, in comparison either with a load-unbalance-type architecture of the sense circuit, represented by the wide range of the operating voltage, substantially unlimited toward the VCC$_{max}$, or the current-offset-type circuits of prior art architecture, represented by the freedom from error in the transient response, which entails a smaller access time of the memory array.

In accordance with an alternative embodiment of the invention, the current generating circuit for the sense circuit of the invention may also be realized in the form shown in the diagram of FIG. 8. The diagram is similar to that of FIG. 5, and therein the current contribution given by the cell n2 at the moment of generating the unbalancing current lacks completely. As already seen before, the effect which is obtained in terms of offsetting the currents in the two branches: MATRIX BITLINE and REFERENCE BITLINE, may be considered similar to the effect occurring in a load-unbalancetype sense circuit. Although, if the effect of the cell n6', connected as shown in the figure to the REFERENCE BITLINE, is considered too, and assuming the transistors n3, n4 and n5 also electrically equivalent to array cells, programmed in an ON-condition, it is evident that upon an increase of the VCC, the gate voltage of the transistor n6' will assume a value sufficiently high to drive a current on the reference column line, REFERENCE BITLINE, having an intensity, which though lower than that of an eventual current carried by an array cell, programmed in an OFF-condition (written cell) during reading, is sufficient to shift toward a higher voltage the point wherein the reference current $I_{ref}$ characteristic crosses the current $I_{off}$ of an array cell, programmed in an OFFcondition (written cell), thus increasing the VCC$_{max}$ limit of operation of the circuit.

Figure 9:
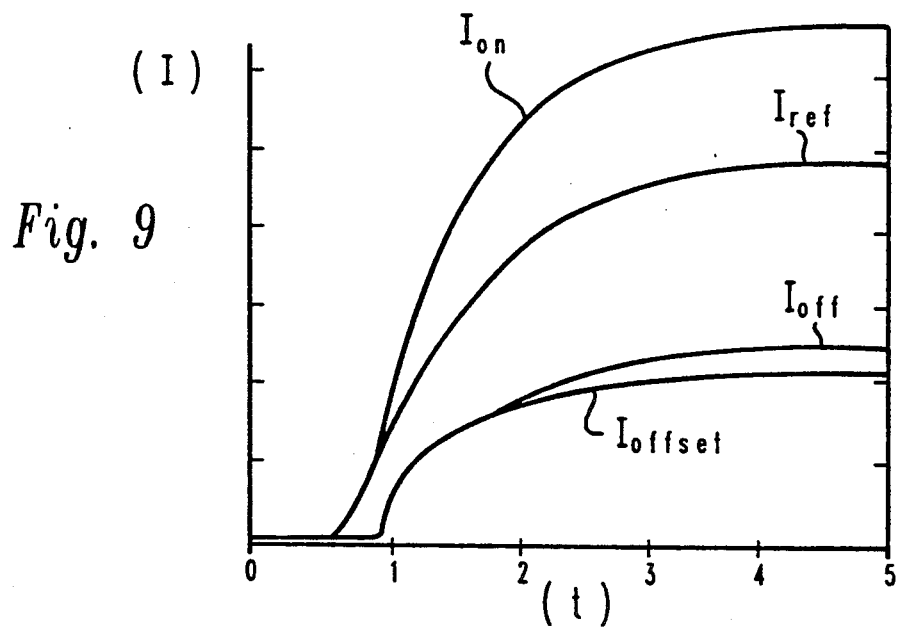
FIG. 9 depicts the dynamic characteristics of operation of the circuit of FIG. 8.

In the diagram of FIG. 9 the dynamic characteristics of the circuit of FIG. 8 are depicted, which clearly appear even further improved in comparison with the dynamic characteristics of the circuit of FIG. 5, as will be remarked later.

Figure 10:
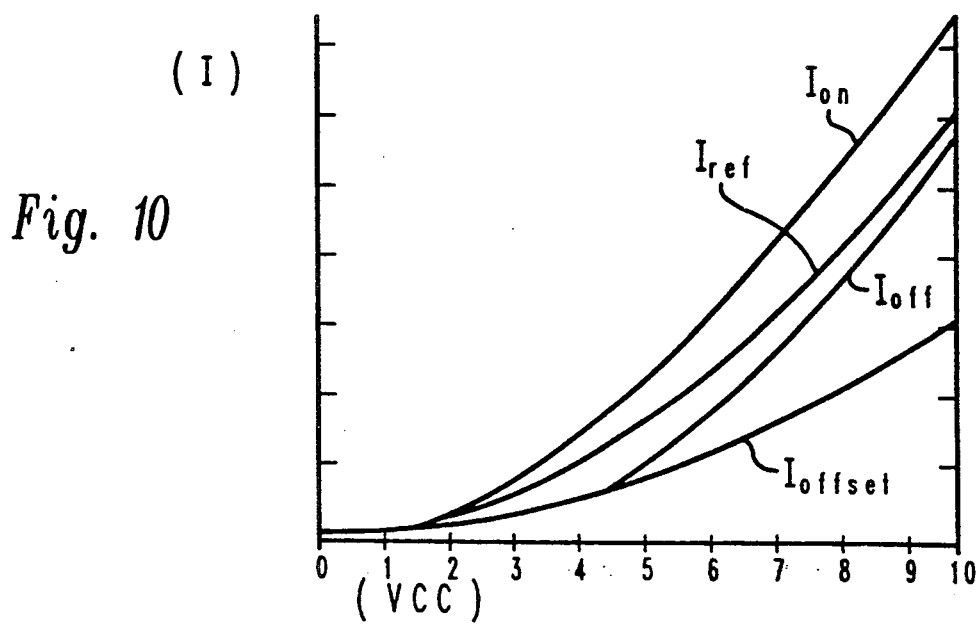
FIG. 10 depicts the static characteristics of operation of the circuit of FIG. 8.

In the diagram of FIG. 10, the static operation characteristics of a reading circuit employing the current generating circuit of FIG. 8 are depicted. The mentioned increased limit of the operation range toward VCC$_{max}$ may be recognized by the fact that the reference current $I_{ref}$ curve no longer crosses the $I_{off}$ current curve of an OFF-programmed cell, notwithstanding that the voltage VCC become larger than 10 V.

The current generating circuit according to the FIG. 8 embodiment, does not provide a static operation performance comparable to that of the circuit made in accordance with the FIG. 5 embodiment which, as shown before, has no limitation toward VCC by virtue of the contribution of transistors n2 and n6. The circuit of FIG. 8 is nevertheless simpler to implement because the required supplementary row, DUMMY ROW, drives a single transistor instead of three transistors and therefore has a reduced capacitive load, positively reflecting upon the dynamic response of the current generating circuit. In fact, by comparing the dynamic characteristics of FIG. 6 and 9, it may be observed that, for the circuit of FIG. 8, the characteristic curves of the reference current $I_{ref}$ and of the current $I_{on}$ of an ON-programmed cell, diverge more rapidly during a transient than those of the circuit of FIG. 5.

What we claim is:

1. A sense circuit for reading EPROM and/or ROM type memory cells, programmable in an ON-condition or in an OFF-condition, organized in an array of columns and rows of cells, selectively addressable through row lines and bit lines, employing a differential amplifier for discriminating the conductivity of a selected array cell from the conductivity of a reference cell in an ON-condition, functionally connected in series to a first branch and to a second branch, respectively, of an input circuit of said differential amplifier, between a supply rail and ground, and offsetting means, capable of causing a discriminating unbalancing between the values of the currents flowing through said two branches of the input circuit of the differential amplifier, between the supply rail and ground, characterized by the fact that said offsetting means is an offsetting current generating circuit formed by at least a transistor (nl) having electrical characteristics equivalent to the electrical characteristics of anyone cell of said memory cells programmed in an ON-condition, and having a gate to which a driving voltage essentially identical to the voltage applied to a gate of a selected array cell to be read is applied for generating a first current ($I_{on}$) substantially identical to the current flowing through a selected array cell which is programmed in an ONcondition;

a first current mirror capable of mirroring said first generated current ($I_{on}$) in an output branch of said first mirror;

a second current mirror, connected to said output branch of said first current mirror and capable of splitting said first current ($I_{on}$) into two identical semicurrents, one of which ($_{offset}$) is forced through said first branch of said input circuit of said differential amplifier comprising said selected array cell to be read thus causing said discriminating current unbalance;

said driving voltage of said first transistor being provided by means of a supplementary row of cells, which supplementary row is decoded at every reading and which replicates, during transients, the electrical behaviour of the row of the array which includes said selected cell to be read.

2. A sense circuit for reading EPROM and/or ROM type memory cells, programmable in an ON-condition or in an OFF-condition, organized in an array of columns and rows of cells, selectively addressable through row lines and bit lines, employing a differential amplifier for discriminating the conductivity of a selected array cell from the conductivity of a reference cell in an ON-condition, functionally connected in series to a first branch and to a second branch, respectively, of an input circuit of said differential amplifier, between a supply rail and ground, and offsetting means capable of causing a discriminating unbalancing between the values of the currents flowing through said two branches of the input circuit of the differential amplifier, between the supply rail and ground, characterized by the fact that said offsetting means is an offsetting current generating circuit formed by at least a transistor (nl) having electrical characteristics equivalent to the electrical characteristics of anyone cell of said memory cells programmed in an ON-condition, and having a gate to which a driving voltage essentially identical to the voltage applied to a gate of a selected array cell to be read is applied for generating a first current ($I_{on}$) substantially identical to the current flowing through a selected array cell which is programmed in an ONcondition;

a second transistor (n2) having electrical characteristics equivalent to the electrical characteristics of anyone of said memory cells programmed in an OFF-condition, connected substantially in parallel with said first transistor (nl) for generating an additional current ($I_{off}$) which is substantially identical to the current flowing through a selected array cell programmed in an OFF-condition;

a first current mirror capable of mirroring a sum current ($I_{on}+I_{off}$) of said currents generated by said first and said second transistors in an output branch of said first mirror;

a second current mirror, connected to said output branch of said first mirror and capable of splitting said sum current into two identical semicurrents, one of which ($I_{offset}$) is forced through said first branch of said input circuit of said differential amplifier which includes said selected array cell to be read, thus determining said discriminating current unbalance;

a third transistor (n6), having the same characteristics of said second transistor (n2), connected into said second branch of said input circuit including said reference cell and having a gate to which a driving voltage essentially identical to the voltage which is applied to the gate of said selected cell to be read is applied for forcing a current identical to said additional current ($I_{off}$) through said second branch of said input circuit including said reference cell;

said driving voltage of said first, second and third transistors, being provided by a supplementary row of cells which is decoded at every reading and which replicates, during transients, the electrical behaviour of the row of the array which contains said selected cell to be read;

the reading conditions of a memory cell programmed in an ON-condition and of a memory cell programmed in an OFFcondition being represented, respectively, by the disequalities between the currents which flow through said second branch containing said reference cell ($I_{ref}$) and said first branch containing said cell to be read ($I_{mat}$): $I_{ref}<I_{mat}$ and $I_{ref}>I_{mat}$, respectively, and which are detected by means of said differential amplifier, being satisfied both by the univocal condition: $I_{on} > I_{off}$, which is intrinsically true.

3. A sense circuit for reading EPROM and/or ROM type memory cells, programmable in an ON-condition or in an OFF-condition, organized in an array of columns and rows of cells, selectively addressable through row lines and bit lines, employing a differential amplifier for discriminating the conductivity of selected array cell from the conductivity of a reference cell in an ON-condition, functionally connected in series to a first branch and to a second branch, respectively, of an input circuit of said differential amplifier, between a supply rail and ground, and offsetting means capable of causing a discriminating unbalancing between the values of the currents flowing through said two branches of the input circuit of the differential amplifier, between the supply rail and ground, characterized by the fact that said offsetting means is an offsetting current generating circuit formed by at least a transistor (nl) having electrical characteristics equivalent to the electrical characteristics of anyone cell of said memory cells programmed in an ON-condition, and having a gate to which a driving voltage essentially identical to the voltage applied to a gate of a selected array cell to be read is applied for generating a first current ($I_{on}$) substantially identical to the current flowing through a selected array cell which is programmed in an ON-condition;

a first current mirror capable of mirroring said first generated current ($I_{on}$) in an output branch of said first mirror;

a second current mirror, connected to said output branch of said first current mirror and capable of splitting said first current ($I_{on}$) into two identical semicurrents, one of which ($I_{offset}$) is forced through said first branch of said input circuit of said differential amplifier comprising said selected array cell to be read thus causing said discriminating current unbalance;

a second transistor (n6'), having electric characteristics equivalent to the characteristics of anyone cell of said memory cells programmed in an OFF-condition, connected into said second branch of said input circuit which contains said reference cell and having a gate to which a driving voltage of a fractionary value in respect to the voltage of said supply rail, is applied for forcing a current ($I_{off}$) of fractionary value in respect to the current which flows through a selected array memory cell programmed in an OFF-condition, condition, through said second branch of said input circuit which contains said reference cell;

said driving voltage of said first transistor being essentially identical to the voltage applied to the gate of the selected array cell to be read and being provided by a supplementary row of cells, which is decoded at every reading and which replicates during transients, the electrical behaviour of the row of the array which contains said selected cell to be read.

* * * * *